United States Patent
Ravi et al.

(10) Patent No.: US 7,365,003 B2
(45) Date of Patent: Apr. 29, 2008

(54) CARBON NANOTUBE INTERCONNECTS IN POROUS DIAMOND INTERLAYER DIELECTRICS

(75) Inventors: Kramadhati V. Ravi, Atherton, CA (US); Tan Shida, Milpitas, CA (US); Jim Maveety, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 337 days.

(21) Appl. No.: 11/026,315

(22) Filed: Dec. 29, 2004

(65) Prior Publication Data

US 2006/0138658 A1 Jun. 29, 2006

(51) Int. Cl.
*H01L 21/4763* (2006.01)
(52) U.S. Cl. ..................... 438/637; 438/778
(58) Field of Classification Search ........ 438/637, 438/778
See application file for complete search history.

(56) References Cited

U.S. PATENT DOCUMENTS

| 6,548,313 B1 | 4/2003 | Ravi et al. |
| 2005/0227079 A1* | 10/2005 | Ravi ............ 428/408 |
| 2005/0277303 A1 | 12/2005 | Ravi et al. |
| 2006/0276030 A1* | 12/2006 | Wang et al. ......... 438/631 |

* cited by examiner

*Primary Examiner*—Jack Chen
(74) *Attorney, Agent, or Firm*—David P. McAbee

(57) ABSTRACT

A method and structure for using porous diamond interlayer dielectrics (ILDs) in conjunction with carbon nanotube interconnects is herein described. A diamond ILD is deposited on an underlaying layer. The diamond layer is optionally and selectively removed of non-sp3 bond to create a porous diamond film. Trenches and vias are etched in the porous diamond ILD. Carbon nanotubes are deposited on the diamond ILD filling the trenches using a liquid crystal host-carbon nanotube solution. Using methods of nematic liquid crystal alignment, the carbon nanotubes are aligned under the influence of the liquid crystals. At least some of the liquid crystal solution is removed leaving an aligned carbon nanotubes.

18 Claims, 9 Drawing Sheets

CARBON NANOTUBE INTERCONNECTS IN POROUS DIAMOND INTERLAYER DIELECTRICS

FIELD

This invention relates to the field of fabricating interconnect structures, and in particular, to using carbon nanotubes interconnects in porous diamond dielectrics.

BACKGROUND

Modern integrated circuits generally contain several layers of interconnect structures fabricated above a substrate. The substrate may have active devices and/or conductors that are connected by the interconnect structure.

Interconnect structures, typically comprising trenches and vias, are usually fabricated in, or on, an interlayer dielectric (ILD). It is generally accepted that, the dielectric material in each ILD should have a low dielectric constant (k) to obtain low capacitance between conductors. Decreasing this capacitance between conductors, by using a low dielectric constant (k), results in several advantages. For instance, it provides reduced RC delay, reduced power dissipation, and reduced cross-talk between interconnects. Increased capacitance and resistance introduces a time delay that limits the maximum rate at which data can be transferred to and from the devices within an integrated circuit.

Examples of low k dielectric materials currently used include silicon dioxide and carbon doped oxide (CDO) materials. However, a low k material, such as silicon dioxide, typically has a dielectric constant in the range of 4. As the speed of integrated circuits continue to increase, lower k dielectric materials are needed to ensure time delays do not limit the faster rates at which data is transferred between devices at. One possibility for decreasing the dielectric constant of silicon dioxide and carbon doped oxide ILDs is to increase their porosity.

Yet, silicon dioxide at a dielectric constant of 4 exhibits a mechanical strength in the range of 80-100 GPa, while CDOs exhibits a mechanical strength in the range of 2-4 GPa. Increasing the porosity of these ILDs and lowering their mechanical strength may lead to mechanical and structural problems during subsequent wafer processing, such as during assembly and packaging. It is well known that diamond films exhibit very high mechanical strength, e.g. 1000 GPa. However, the dielectric constant of diamond films as deposited by such processes as chemical vapor deposition are typically about 5.7.

Additionally, current interconnect structures usually use copper, copper alloy, or some other metal as conductors to transfer data between devices. Using copper as a conductor in an interconnect structure potentially creates two problems: (1) dispersion of electrons and (2) electromigration of metal atoms. Dispersion of electrons occurs when electrons scatter in the lattice structure of a conductor degrading the signal sent across a conductor, such as copper. Electromigration occurs when metal atoms flow along with electrons across a conductor leaving holes. As interconnects become smaller, current densities increase, and the need for interconnect materials with good resistivity to electromigration and electron dispersion becomes more important.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth such as examples of specific plasma gasses, etchants, temperatures, pressures, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

Figure 1:
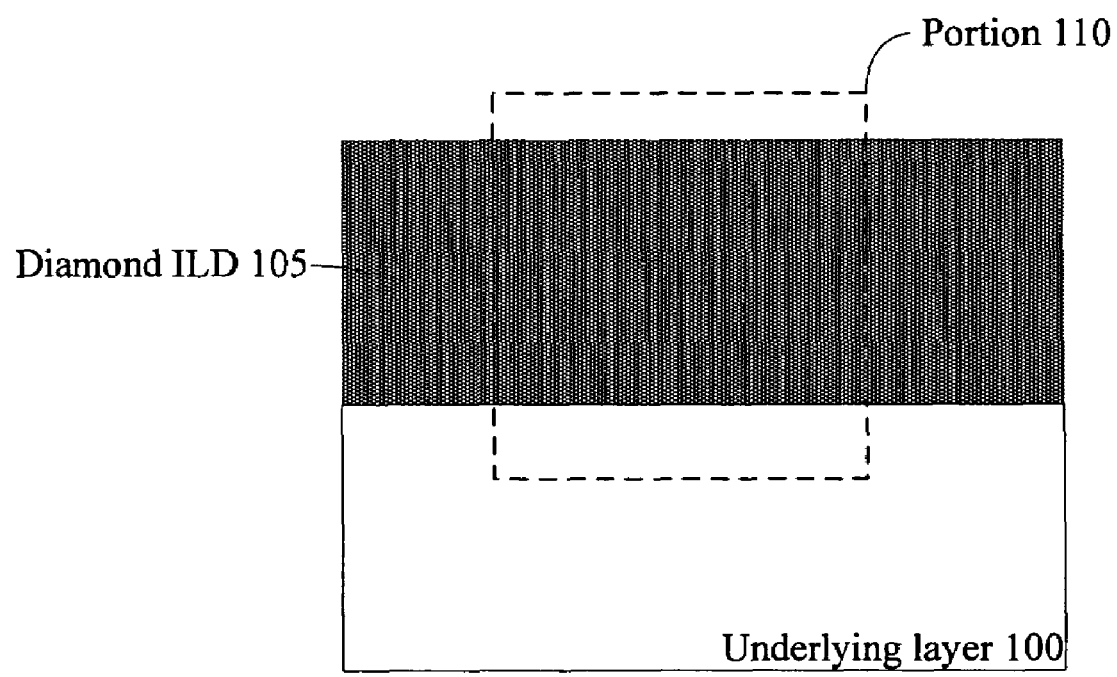
FIG. 1 illustrates a cross-sectional view of an embodiment of a diamond interlayer dielectric (ILD) disposed on an underlying layer.

Referring first to FIG. 1, an underlying layer 100 is illustrated, which often is comprised of several active devices and/or a layer with exposed conductors. Examples of conductors include metal interconnects, such as copper interconnects, carbon nanotube interconnects, connection pads to active/passive devices, polysilicon conductors, and any other conductors to make electrical contact to structures in underlying layer 100.

In one embodiment, underlying layer 100 is a semiconductor wafer including device regions, other structures such as gates, local interconnects, metal layers, or other active/passive device structures or layers. As an example, underlying layer 100 comprises a substrate, such as silicon, silicon-on-insulator, germanium, indium, antimonide, lead telluride, indium arsenide, indium phosphide, gallium arsenide, and gallium antimonide. Other specific examples of devices that may be present in underlying layer 100 include resistors, capacitors, inductors, transistors, or other integrated circuit devices.

Disposed on underlying layer 100 is diamond interlayer dielectric (ILD) 105. Diamond ILD 105 may be deposited using methods suitable for deposition of diamond films known in the art, such as plasma enhanced chemical vapor deposition (PECVD). In one embodiment, depositing diamond ILD 105 is done under a pressure in the range of 10 to 100 Torr, a temperature of 300 to 900 degrees, and a power between 10 kW to about 200 kW. Methods of plasma generation may include DC glow discharge CVD, filament assisted CVD and microwave enhanced CVD.

Figure 2A:
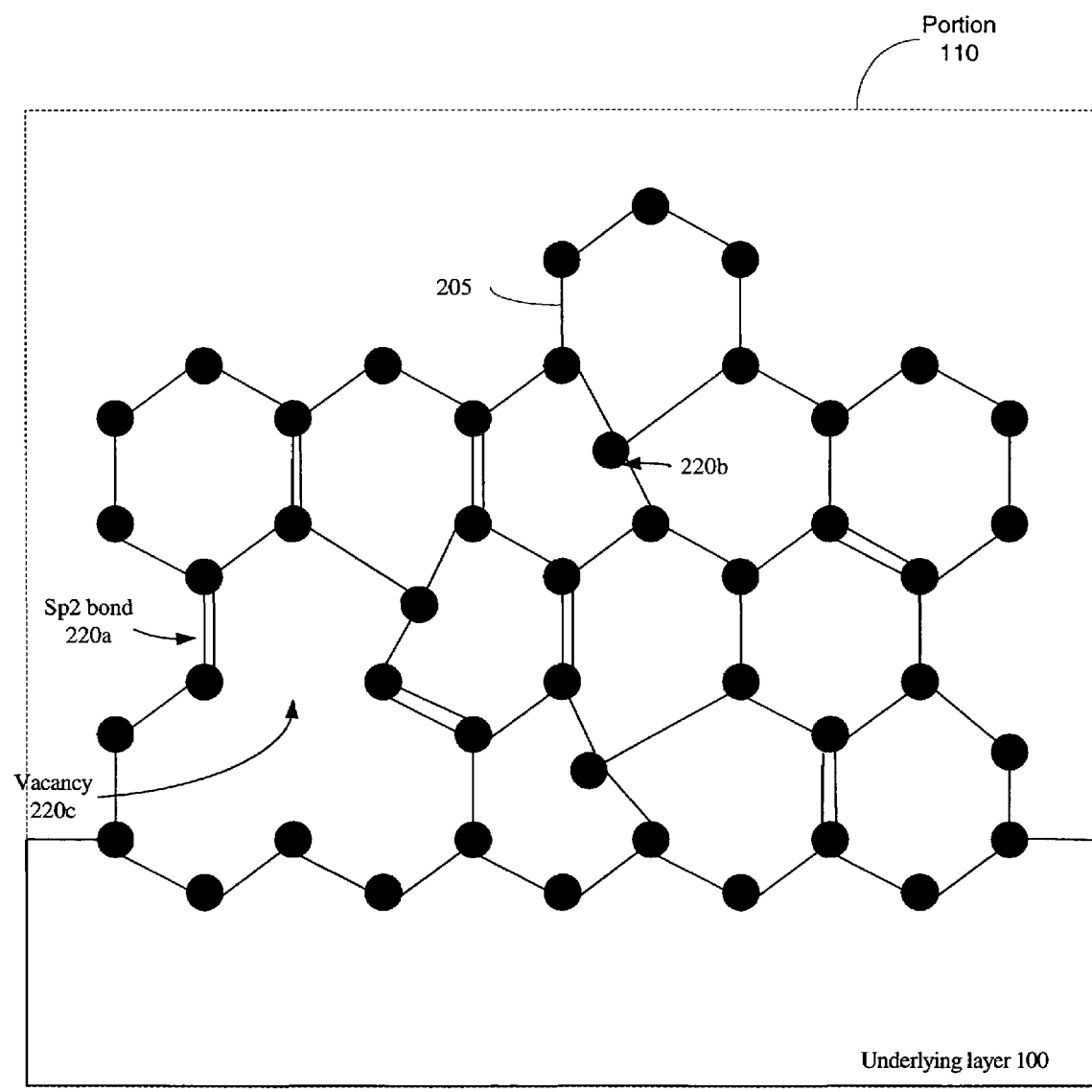
FIG. 2a illustrates an enlarged portion of FIG. 1.

In turning to FIG. 2a, deposition and formation of diamond ILD 105 is discussed in reference to enlarged portion 110 of FIG. 1. Formation and deposition of diamond films is discussed in detail in a co-pending application with Ser. No. 10/823,836 entitled, "Manufacture of Porous Diamond Films," herein referred to as Ravi.

In one embodiment, diamond ILD 105 is deposited using a deposition chamber, as described in Ravi. As an alternative, hydrocarbon gases such as $CH_4$, $C_2H_2$, fullerenes or solid carbon gas precursors may be used to form diamond ILD 105. The hydrocarbon gas is mixed with hydrogen gas at a concentration of approximately 10 percent hydrocarbon gas in relation to the concentration of hydrogen gas. However, the concentrations of hydrocarbon gas is not so limited, as it can be readily varied. In fact, hydrocarbon concentrations of about 10 percent or greater generally result in the formation of a diamond ILD 105 that comprises a number of defects 220 in the crystal lattice of the diamond ILD 105, such as double bonds 220a (commonly referred to as sp2 bonds), interstitial atoms 220b and vacancies 220c. Diamond ILD also comprises diamond bonds or sp3 bonds, such as single bond 205.

Defects 220 may comprise any non-sp3 bonds, i.e. non-diamond bonds, as well as any forms of anomalies, such as graphite, vacancies, or other non-diamond forms of carbon, in the crystal lattice. As one example, diamond ILD 105 comprises a percentage of defects in the range of 10 to 80 percent. The percentage of sp2 type bonds in diamond ILD 105 may be increased by increasing the percentage of hydrocarbon gas, such as methane, that is used during formation. Therefore, after etching the sp2 bonds to create pores, the dielectric constant is lowered. In one embodiment, at approximately a 30 percent hydrocarbon gas, the dielectric constant (k) is approximately 2.0, and potentially decreases with further increase of the hydrocarbon percentage.

Figure 2B:
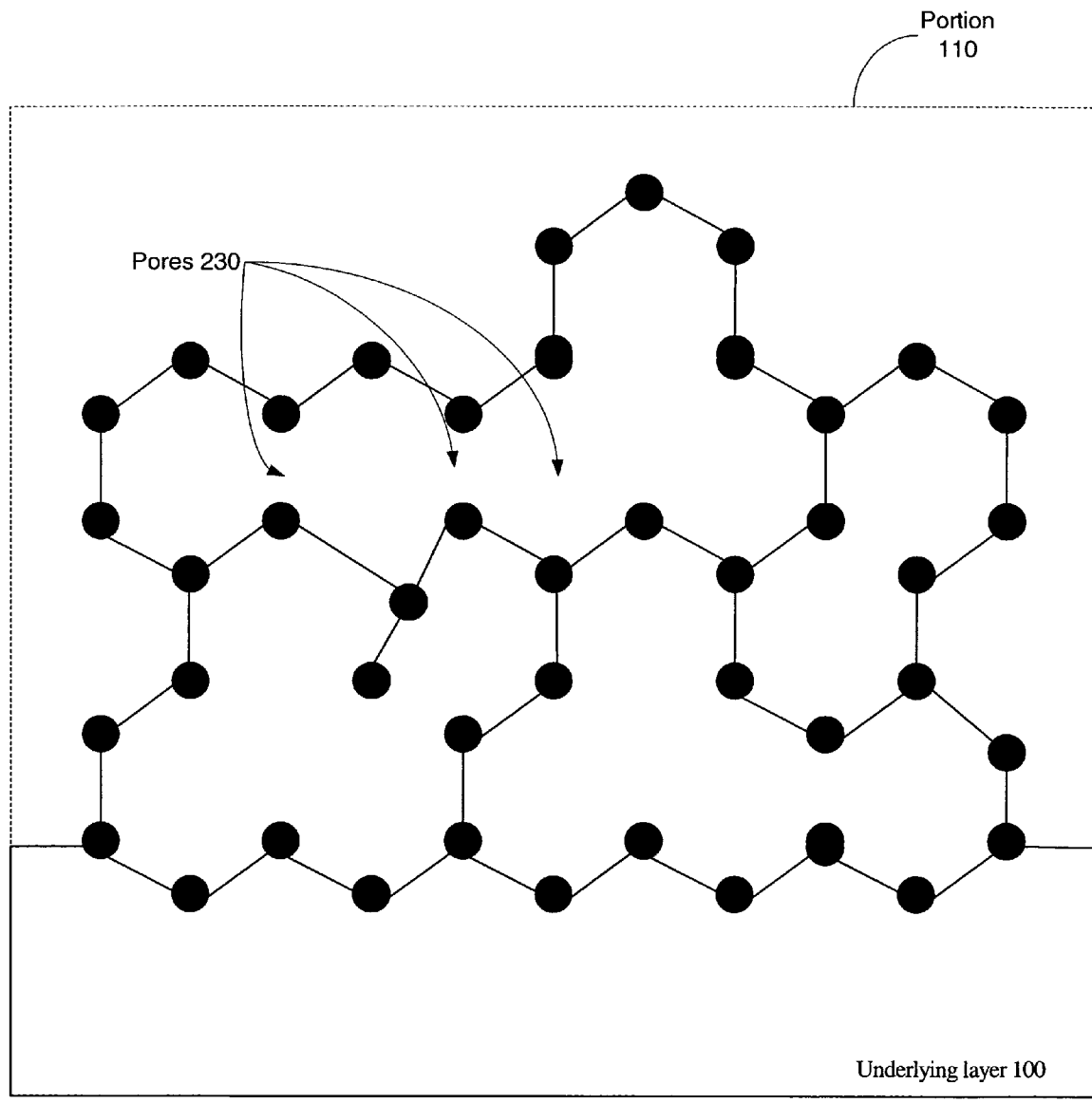
FIG. 2b illustrates the structure of FIG. 2a after selectively removing non-diamond bonds in the diamond ILD.

Referring next to FIG. 2b, defects 220 are selectively removed to form pores 230. In one embodiment, the defects 220 are removed by utilizing an oxidation process. As an example oxidation process comprises utilizing molecular oxygen and heating the diamond ILD 105 to a temperature of approximately 450 degrees Celsius. As another embodiment of an oxidation process, molecular oxygen is used in combination with a rapid thermal processing (RTP) apparatus, as is well known in the art. Another example of removing defects 220 includes using an oxygen and/or a hydrogen plasma. The use of a hydrogen plasma preferentially etches the non-diamond forms of carbon, while it does not substantially attack the diamond forms of carbon. The use of oxidation or plasma etch selectively targets defects 220 and does not substantially target single sp3 bonds in the lattice structure of diamond ILD 105. After etching defects 220, pores 230 comprise vacancies and/or missing atoms in diamond ILD 105's lattice structure.

Pores 230, in now porous diamond ILD 105, lower the k of a pure diamond ILD, which is around 5.2, to a k value approximately between 1.9 and 4. In one embodiment, ILD 105 has a k value in the range of 1.9 to 2.5. As a specific example, ILD 105 has a k value of 1.95. The presence of the rigid sp3 bonds in porous diamond ILD 105 confers the benefits of the high mechanical strength of a "pure" type diamond film with the low dielectric constant of a porous film. The strength modulus of porous diamond ILD 105 is in a range of 6 GPa to 1000 Gpa, the common strength modulus of a pure diamond film. Thus, by introducing porosity, which comprises voids, missing atoms, and other such internal discontinuities in the diamond lattice, the methods of herein described enable the formation of a low dielectric constant and high mechanical strength diamond ILD 105.

Figure 3:
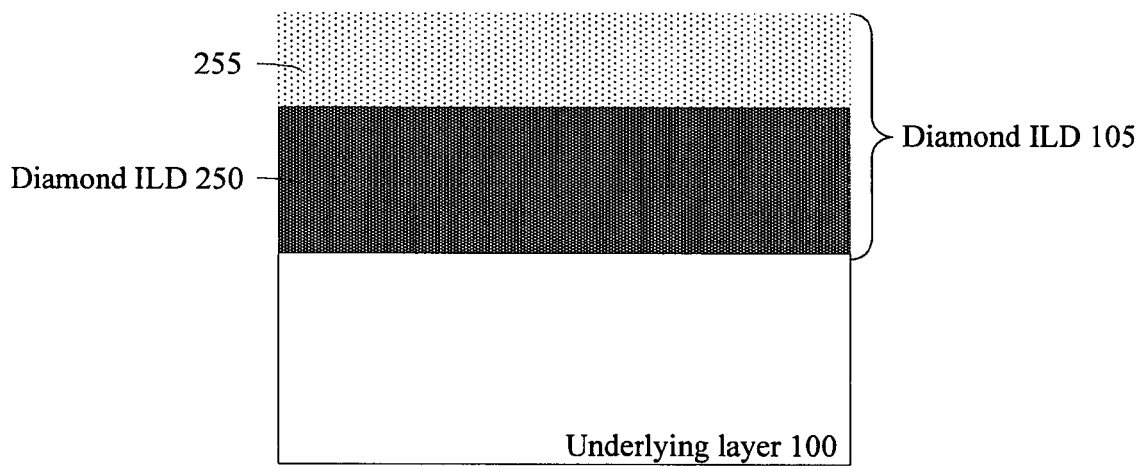
FIG. 3 illustrates a cross-sectional view of an embodiment of a diamond interlayer dielectric (ILD) having multiple layers disposed on an underlying layer.

FIG. 3 illustrates an embodiment of forming multiple diamond layers to form diamond ILD 249. In one embodiment a multi-layered diamond ILD is formed by depositing diamond ILD 249, as discussed above, and selectively etching top portion 255 of diamond ILD 249 creating a substantially defect free top portion 255. As an example, diamond ILD 249 is deposited and exposed to hydrogen plasma, i.e. passivated, to selectively remove defects from top portion 255 of diamond ILD 249.

Alternatively, a first diamond ILD 250 is deposited on underlying layer 100. Then a second diamond ILD 255 is deposited on diamond ILD 250. Defects are selectively removed from diamond ILD 255 (top portion 255) to form a porous diamond ILD 255. Consequently, diamond ILD 249 comprises a multi-layered diamond ILD having a first diamond layer 250 and a second porous diamond layer 255. Furthermore, another diamond layer may be deposited and the process repeated to form alternating diamond and porous diamond layers. As shown from these embodiments, depositing and etching of a diamond ILD may be repeated to form a multilayered diamond ILD.

Figure 4:
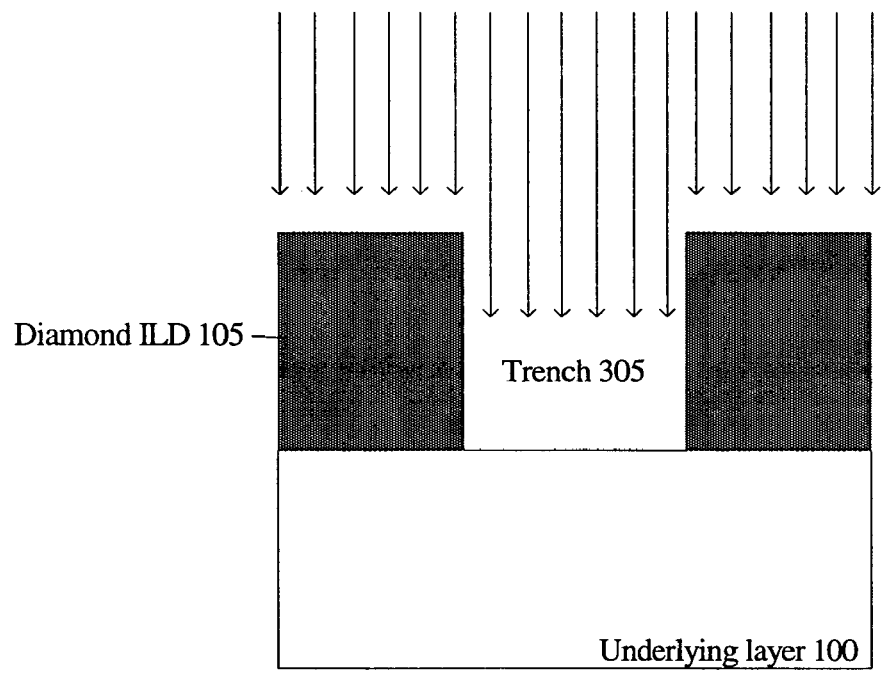
FIG. 4 illustrates the structure of FIG. 1 after a trench is etched in the diamond ILD.

Turning to FIG. 4, after a diamond ILD, such as diamond ILD 105 or 249, is deposited, at least trench 305 is etched in diamond ILD 249. Commonly known patterning and etching techniques are used to etch trench 305. As an illustration, diamond ILD 249 is patterned and trench 305 is etched using oxygen plasma. In one embodiment trench 305 has a width of up to 0.5 microns and a depth of up to 0.8 microns. Additionally, via openings, not shown, may be etched in diamond ILD 249. In fact, commonly an opening, such as a trench, as well as another opening, such as a via, will be etched into an ILD, the via for making the electrical contact to the underlying layer. Etching via and trench openings, as well as common connection methods to underlying layers are well known in the art. Other common processing techniques, such as use of etch stops, hard masks, and barrier layers may also be used; however, to avoid obscuring the invention these steps are not discussed in detail. Yet, as one example a silicon nitride or oxide film is used as a barrier layer to protect exposed pores of trench 305 during deposition of a liquid crystal-cabon nanotube solution, which is described below.

Figure 5:
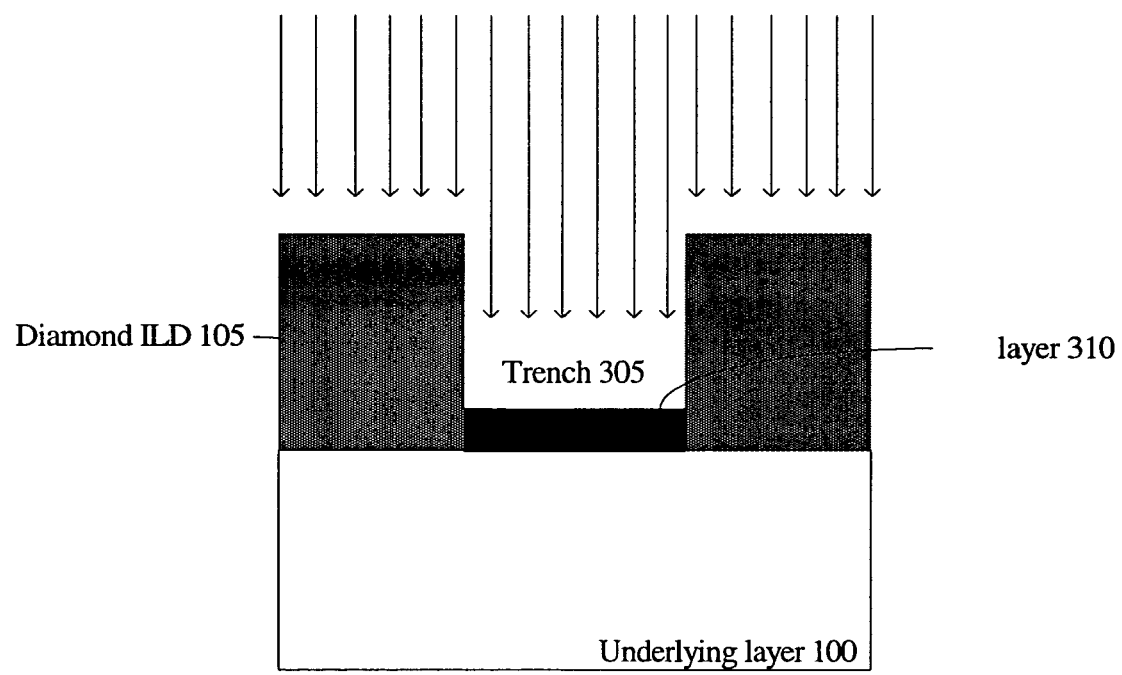
FIG. 5 illustrates the structure of FIG. 3a after a layer is deposited in the trench.

Next, FIG. 5 illustrates deposition of layer 310. In one embodiment layer 310 is an ohmic contact. Ohmic contacts may be deposited using chemical vapor deposition (CVD), plasma vapor deposition (PVD), PECVD, or other commonly known deposition method. As an example, an ohmic contact comprises a film of metal, such as titanium or tungsten. Deposition of ohmic contacts is discussed in more detail in a co-pending application with Ser. No. 10/159,236 entitled, "Amorphous Carbon Insulation and Carbon Nanotube Wires," herein referred to as Ravi et. al.

In another embodiment layer 310 is a catalyst, such as chromium or nickel, for growing a carbon nanotube. It is readily apparent that layer 310 may comprise both a catalyst and an ohmic contact, as well as a material that acts both as a catalyst and ohmic contact.

Figure 6:
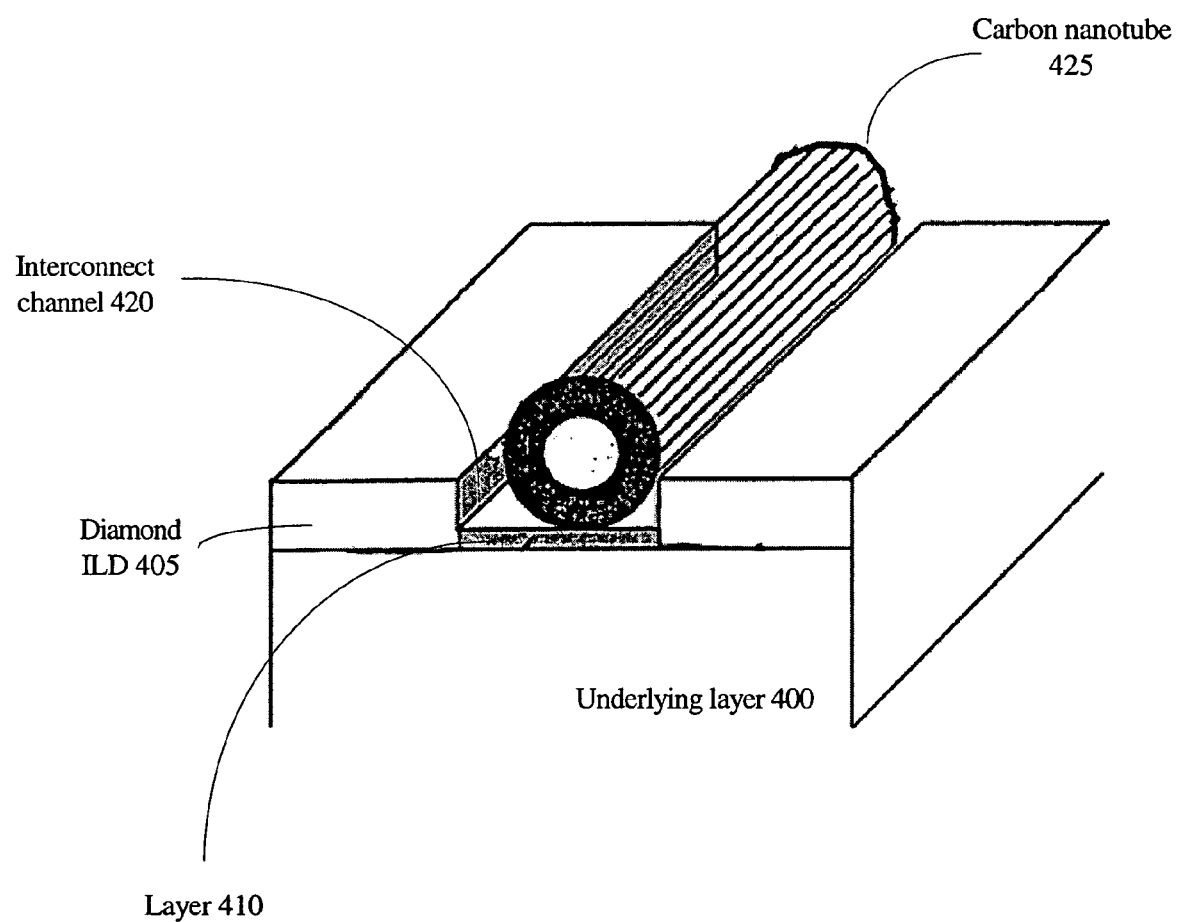
FIG. 6 illustrates an embodiment of a carbon nanotube being grown laterally in an interconnect channel.

Turning to FIG. 6, an embodiment of forming carbon nanotube 425 in interconnect channel 420, which is analogous to a trench, is shown. A carbon based precursor material is deposited as a film of amorphous carbon, crystalline carbon, or silicon carbide. Deposition of the carbon based precursor material may be done using PCD, CVD, or PECVD techniques. The carbon based precursor is transformed or grown into cabon nanotube 425 using a gas plasma, such as hydrogen, oxygen, or fluorine plasma. In a specific example, argon is used as a dilutant, the temperature is in a range of 300 to 500 degrees C., at a pressure fo 5 to 50 millitorr for a time of 1 to 20 minutes. During formation, a monolayer of tungsten carbide may form between the carbon nanotube and an ohmic contact, if used. The process of transforming a carbon precursor into a carbon nanotube is discussed in Ravi et al.

As an alternative, a carbon nanotube is grown laterally across interconnect channel 420 using an electric field to induce lateral growth. One embodiment includes deposition of a suitable catalyst such as nickel, cobalt, iron or manganese at one end of channel 420. The growth of carbon nanotubes is catalysed by the catalyst using CVD techniques with precursor gases such as methane, acetylene or other suitable hydrocarbon. Lateral growth is promoted by the application of an electric field parallel to the wafer surface using an induction coil around the plasma chamber in which nanotube growth is conducted.

Figure 7A:
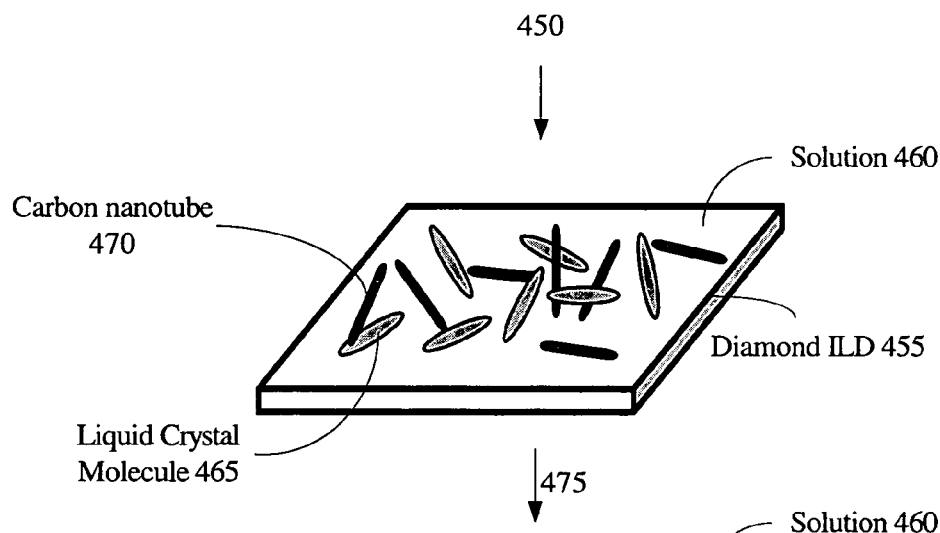
FIG. 7a-7c illustrates an embodiment of depositing a liquid crystal-carbon nanotube solution on an ILD and aligning a carbon nanotube in the solution.

In reference to FIG. 7a, another embodiment of depositing/forming a carbon nanotube is illustrated. In process 450, liquid crystal host-carbon nanotube solution 460 is deposited on diamond ILD 455 to fill any interconnect channels/trenches in diamond ILD) 455. Deposition of solution 460 on diamond ILD 455 may comprise well-known methods of solvent/solution deposition, such as spin-coating, spray-coating, and dip-coating.

Solution 460 comprises at least liquid crystal 465 and carbon nanotube 470. In one embodiment, an arc is struck between carbon atoms vaporizing them. As an example, an arc is struck at high temperatures (>2000C) between two carbon electrodes in an inert atmosphere such a argon. The vaporized carbon contains a plurality of carbon nanotubes which accumulate in the chamber. The carbon nanotubes are collected and purified by dissolving carbonaceous material, such as graphite and soot, in concentrated acids. In another embodiment, carbon nanotubes can be synthesized using chemical vapor deposition processes utilizing a hydrocarbon source such as methane, acetylene, etc and dissociating the gases either by thermal means or by the assistance of a plasma. The nanotubes are deposited on a substrate, such as a siliconwafer and purified.

Solution 460 is created by adding carbon nanotubes to a liquid crystal solution and agitating the solution to suspend the carbon nanotubes. As a specific example, the liquid crystal solution comprises nematic liquid crystal. In one embodiment, the solution is agitated using ultra-sonication to suspend the carbon nanotubes in the liquid crystal host solution. As a range, solution 460 comprises 10 to 80 percent carbon nanotubes and 20 to 90 percent of another solution, such as a liquid crystal host.

Figure 7B:
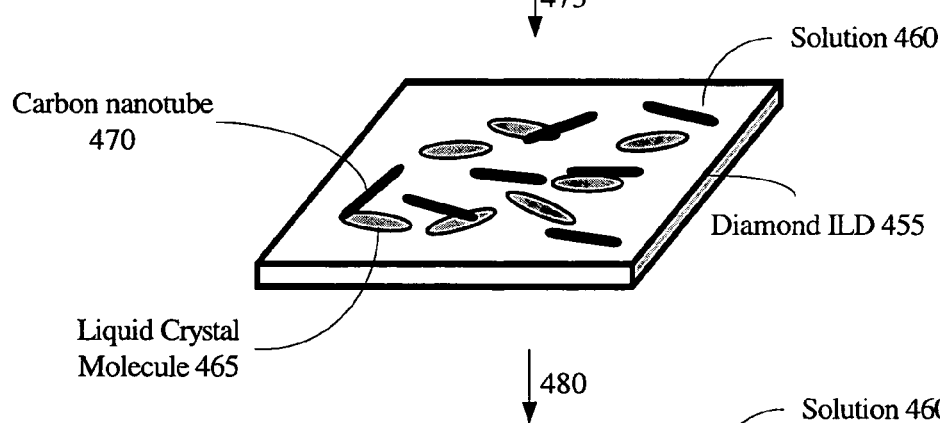
Figure 7C:
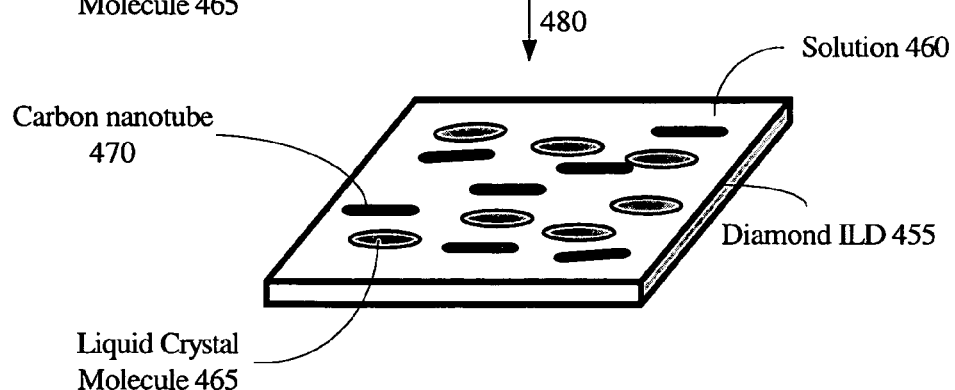

Once solution 460 is deposited on diamond ILD 455, liquid crystals, such as liquid crystal 465 may begin to self-organize, as shown in FIG. 7b. Additionally, in FIG. 7c, an electric field, electromagnetic field, or voltage is applied across diamond ILD 455 and any trenches/interconnect channels to align the carbon nanotubes, such as carbon nanotube 470, in the interconnect channels/trenches under the influence of the liquid crystals, such as liquid crystal 465.

An electric field may be applied by the use of an induction coil around a CVD chamber. When an electromagnetic field is applied, nematic liquid crystals orient parallel to the director. Consequently, the carbon nanotubes in the nematic media align themselves with the liquid crystals. Therefore, well-established methods of aligning and manipulating liquid crystals, including grooved surfaces, magnetic fields, and patterned electrodes may be used to manipulate the alignment of carbon nanotubes. As another example, a voltage in the range of 10-100V is applied across diamond ILD 455 to align the carbon nanotubes.

Figure 8:
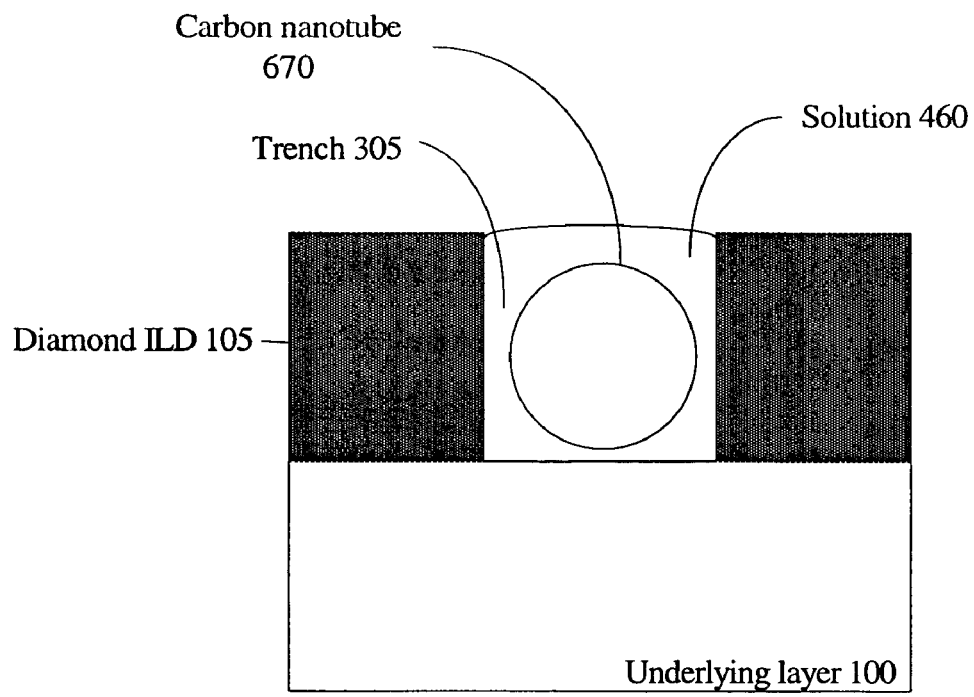
FIG. 8 illustrates the structure of FIG. 3a after a liquid crystal-carbon nanotube solution has been deposited on the ILD filling the trench.
Figure 9:
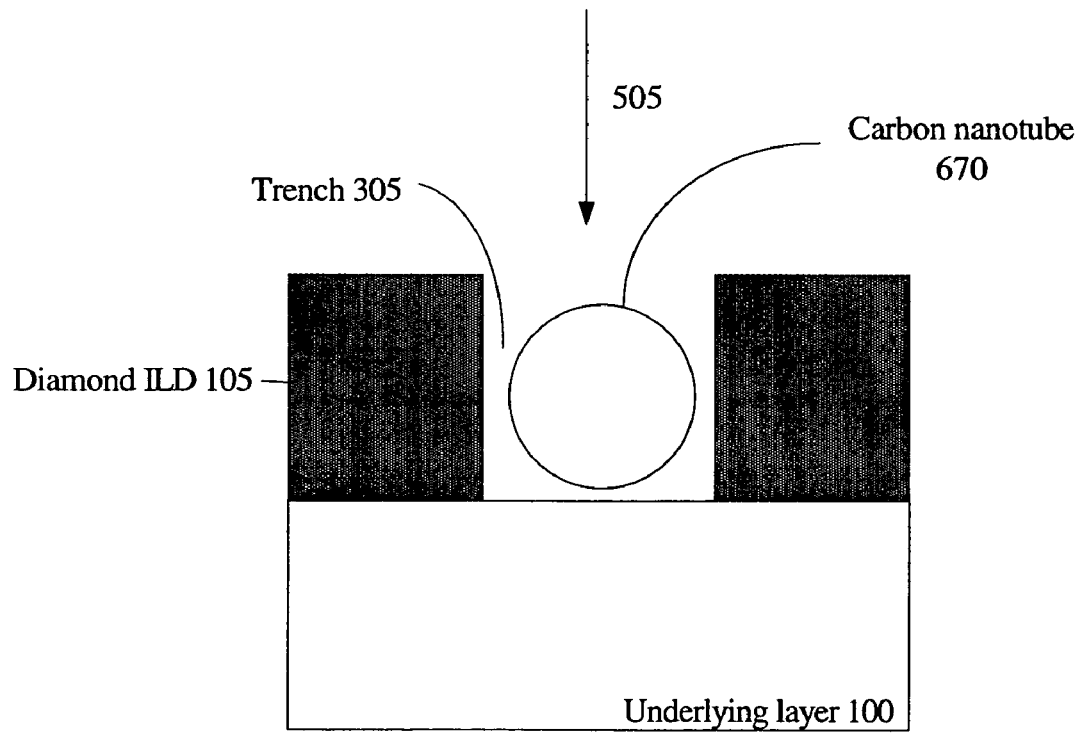
FIG. 9 illustrates the structure of FIG. 8 after the liquid crystal solution has been removed from the trench.

FIG. 8 illustrates an embodiment of trench 305 filled with solution 460, including aligned carbon nanotube 670. In FIG. 9, at least some of solvent/solution 460 is removed leaving aligned carbon nanotube 670. As an example, substantially all of solution 460 is removed under a vacuum. As another example, evaporation of the liquid crystal host may be done under a vacuum. Here, evaporation under a vacuum is done at a temperature of approximately 450 degrees Celsius.

Figure 10:
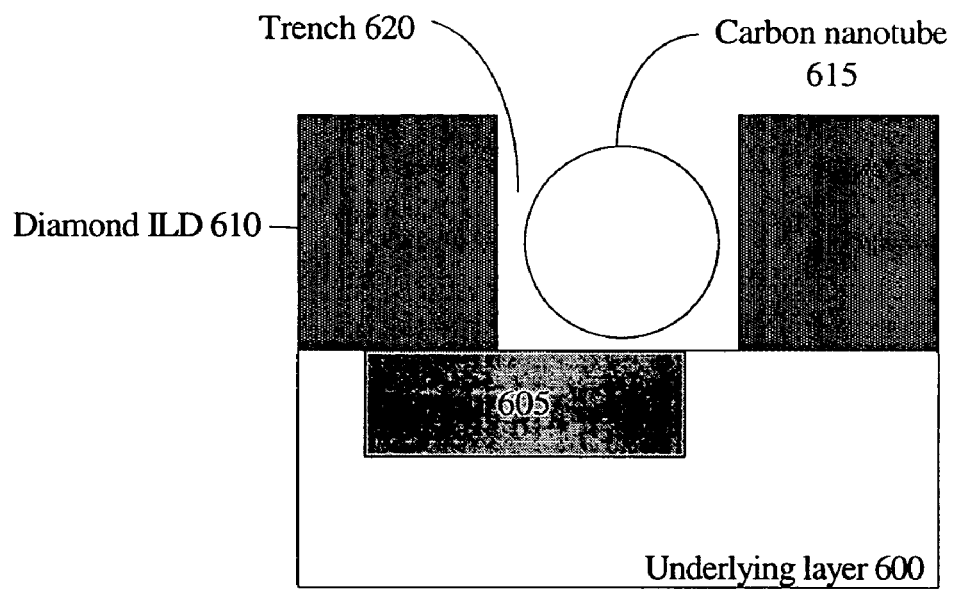
FIG. 10 illustrates a cross-sectional view of an embodiment of a interconnect structure having a trench defined by a diamond ILD disposed on an underlying layer and a carbon nanotube aligned in the trench.

In reference to FIG. 10, an embodiment of a microelectronic structure is illustrated. Opening 620 is defined by diamond ILD 610 disposed on underlying layer 600. As discussed above, both a trench and a via may be present in diamond ILD 610. As an example, the structure shown in FIG. 10 may include a via to make electrical connection between carbon nanotube 615 and conductor 605, where the carbon nanotube is in a trench/interconnect channel. In one embodiment, diamond ILD 610 is a porous diamond ILD formed by the methods described above. Underlying layer 600 comprises conductor 605, which is at least partially exposed in trench 620. Carbon nanotube 615 is aligned in trench 620 to make contact with at least a portion of conductor 605. In one embodiment, carbon nanotube 615 makes electrical connection with conductor 605. It is readily apparent that other structures, such as etch stops, hard masks, barrier layers, as well as other common microelectronic and interconnect structures may be present.

Figure 11:
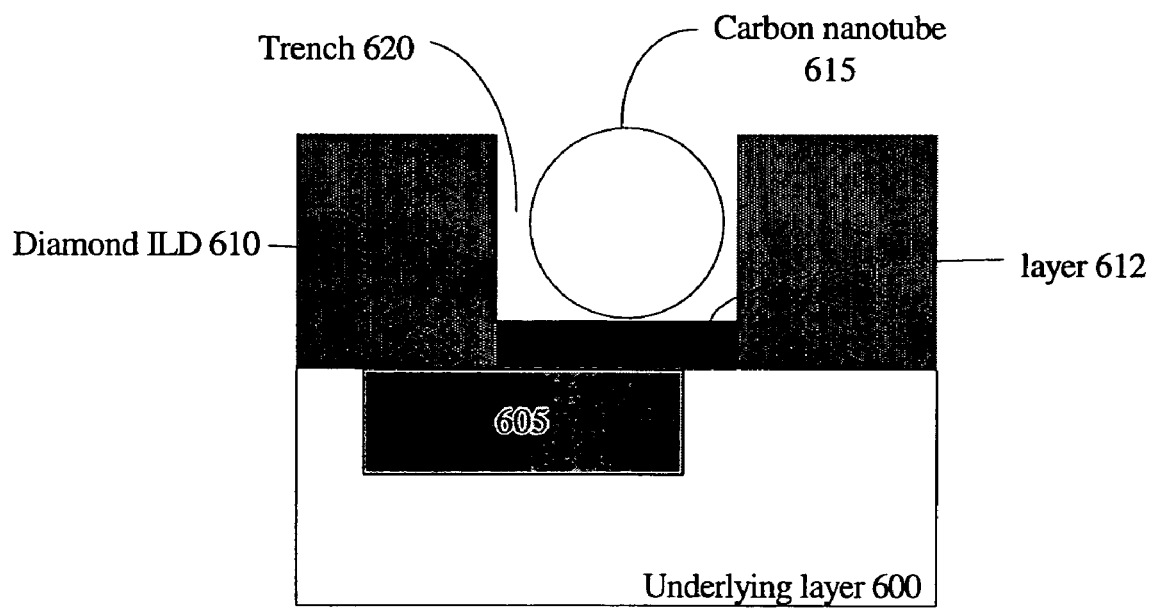
FIG. 11 illustrates a cross-sectional view of an embodiment of a interconnect structure having a trench defined by a diamond ILD disposed on an underlying layer, the underlying layer having a conductor, an ohmic contact disposed on a portion of the conductor, and a carbon nanotube to contact the ohmic contact.

FIG. 11 illustrates another embodiment of an interconnect structure. As above, FIG. 6b depicts underlying layer 600 having conductor 605 at least partially exposed in trench 620. Trench 620 being defined by diamond ILD 610. Further shown is layer 612. In one embodiment, layer 612 is an ohmic contact, as discussed above. As examples, ohmic contact comprises tungsten or titanium. Additionally, a layer 612 of tungsten or titanium nitride, silicide, or carbide may have formed between carbon nanotube 615 and the ohmic contact. In another embodiment, layer 612 comprises remnants of a catalyst used to grow carbon nanotube 615.

As seen from the description above, porous diamond ILDs with low dielectric constants of below 4 are used to obtain reduced RC delay and increased mechanical strength, as compared to previous ILD films, such as silicon dioxide and carbon doped oxide films. Furthermore, the porous diamond films are used in conjunction with carbon nanotubes, which exhibit good resistivity to electromigration and electron dispersion. Since the lattice structure of a carbon nanotube is substantially one dimensional, electrons are able to flow through the lattice structure and not disperse resulting in good conductivity and reduced amounts of electromigration.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method of forming a microelectronic structure comprising:
    depositing a diamond interlayer dielectric (ILD) on an underlying layer;
    etching a trench opening in the ILD;
    depositing a liquid crystal host-carbon nanotube solution on the ILD to fill the trench opening; and
    removing at least some of the liquid crystal host leaving a carbon nanotube in the trench opening.

2. The method of claim 1, wherein the diamond ILD, as deposited, comprises a plurality of non-sp3 diamond bonds.

3. The method of claim 2, further comprising selectively removing at least some of the plurality of non-sp3 diamond bonds to form pores in the diamond ILD.

4. The method of claim 3, wherein depositing a diamond ILD and selectively removing a plurality of non-sp3 bonds to form pores in the ILD is repeated to form a multilayer diamond ILD.

5. The method of claim 4, wherein each layer of the diamond ILD has a different concentration of pores.

6. The method of claim 3, wherein selectively removing at least some of the plurality of non-sp3 diamond bonds comprises oxidizing the diamond ILD.

7. The method of claim 3, wherein selectively removing at least some of the plurality of non-sp3 diamond bonds comprises exposing the diamond ILD to hydrogen plasma.

8. The method of claim 1, wherein etching the trench opening in the diamond ILD comprises patterning the ILD and exposing the ILD to an oxygen plasma.

9. The method of claim 1, wherein depositing the liquid crystal host-carbon nanotube solution comprises spin-coating the solution onto the ILD.

10. The method of claim 1, wherein depositing the liquid crystal host-carbon nanotube solution comprises spraying the solution onto the ILD.

11. The method of claim 1, wherein the underlying layer is another ILD layer having carbon nanotubes.

12. The method of claim 1, wherein the underlying layer comprises a substrate.

13. The method of claim 1, further comprising depositing an ohmic contact in the trench opening between the carbon nanotube and a conductor in the underlying layer.

14. The method of claim 13, wherein the ohmic contact comprises titanium.

15. The method of claim 1, wherein the liquid crystal host is nematic liquid crystal.

16. The method of claim 15, further comprising applying an electric field across the ILD to align the liquid crystals and the carbon nanotubes using an induction coil.

17. The method of claim 16, wherein the carbon nanotubes align under the influence of the liquid crystals.

18. The method of claim 1, wherein removing at least some of the liquid crystal host leaving a carbon nanotube comprises evaporating at least some of the liquid crystal host under a vacuum.

* * * * *